US006271507B2

(12) United States Patent
Godwin

(10) Patent No.: US 6,271,507 B2
(45) Date of Patent: Aug. 7, 2001

(54) APPARATUS AND METHOD FOR BONDING CONDUCTORS

(75) Inventor: Michael S. Godwin, Oxford, MI (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/415,367

(22) Filed: Oct. 8, 1999

(51) Int. Cl.[7] ............... H05B 6/10; H05B 6/40
(52) U.S. Cl. .......... 219/603; 219/661; 219/635; 219/647; 219/659; 219/670; 219/676
(58) Field of Search .................. 219/602, 603, 219/611, 613, 617, 635, 647, 659, 670, 672, 676

(56) References Cited

U.S. PATENT DOCUMENTS

| | | | |
|---|---|---|---|
| 2,509,713 | * 5/1950 | Achard | 219/670 |
| 2,803,731 | 8/1957 | Coburn | 219/9.5 |
| 4,340,038 | 7/1982 | McKean | 128/1.3 |
| 4,355,222 | 10/1982 | Geithman et al. | 219/10.57 |
| 4,359,620 | * 11/1982 | Keller | 219/670 |
| 4,521,659 | 6/1985 | Buckley et al. | 219/10.77 |
| 4,673,781 | * 6/1987 | Nuns et al. | 219/670 |
| 4,789,767 | * 12/1988 | Doljack | 219/670 |
| 4,947,462 | * 8/1990 | Moe | 219/611 |
| 4,983,804 | 1/1991 | Chan et al. | 219/85.11 |
| 5,059,756 | 10/1991 | Henschenp et al. | 219/85.22 |
| 5,227,596 | 7/1993 | McGaffigan et al. | 219/10.43 |
| 5,288,959 | 2/1994 | Henschen | 219/616 |
| 5,350,902 | 9/1994 | Fox et al. | 219/633 |
| 5,374,809 | 12/1994 | Fox et al. | 219/633 |
| 5,378,879 | 1/1995 | Monovoukas | 219/634 |
| 5,412,184 | 5/1995 | McGaffigan | 219/643 |
| 5,526,561 | 6/1996 | McGaffigan | 219/605 |
| 5,580,479 | 12/1996 | Bruns | 219/616 |
| 5,630,958 | 5/1997 | Stewart, Jr. et al. | 219/670 |
| 5,801,358 | 9/1998 | Yokoyama et al. | 219/634 |
| 5,821,638 | 10/1998 | Boys et al. | 307/104 |
| 5,951,903 | * 9/1999 | Isoyama et al. | 219/603 |
| 6,084,225 | * 7/2000 | Schmitt | 219/670 |

FOREIGN PATENT DOCUMENTS

| | | | |
|---|---|---|---|
| 0 449 790 A2 | 3/1991 | (EP) | H01R/43/02 |
| WO 95/11544 | 4/1995 | (WO) | H02J/5/00 |

* cited by examiner

Primary Examiner—Philip H. Leung
(74) Attorney, Agent, or Firm—A. A. Tirva; James C. Paschall

(57) ABSTRACT

An apparatus and method is provided for conductively bonding at least two conductors together. An inductive coil generates a magnetic field when electrical current is run therethrough. A magnetic concentrator is disposed near the inductive coil and adjacent which the two conductors can be positioned for concentrating the magnetic field on the conductors. The concentrator is independent of the conductors. Pressure is applied to the conductors. The concentrator concentrates the magnetic field generated by the inductive coil on the conductors, thereby heating the conductors under pressure and electrically bonding the conductors together.

22 Claims, 5 Drawing Sheets

APPARATUS AND METHOD FOR BONDING CONDUCTORS

FIELD OF THE INVENTION

This invention generally relates to the art of electrical conductors and, particularly, to an apparatus and method for conductively bonding at least two conductors by induction heating.

BACKGROUND OF THE INVENTION

In the art of electrical transmission, conductors are repeatedly coupled so that electrical current flows from one conductor to another through some type of electrical interface. An electrical wire, for instance, often is connected to another electrical wire, to a conductor on a flat circuit such as a flat flexible circuit, to a circuit trace on a printed circuit board or in all kinds of combinations of such conductors. Often, two respective conductors are interconnected or electrically coupled by a soldering material. The solder is heated to its melting point and, when solidified, the solder mechanically and electrically or conductively joins the two conductors.

For example, a flat flexible circuit typically includes a plurality of flexible conductors which often are generally parallel to each other similar to the electrical wires of a hard-wired electrical cable. The flexible conductors are in a plane and are adhered to a flexible insulating substrate, such as an elongated substrate. Most often, the conductors are sandwiched between a pair of flexible insulating layers or films. The films and conductors are held in their flat configuration by an appropriate adhesive. When it is required to connect the conductors of a flat flexible circuit to the conductors of another circuit or other conducting member, the insulating substrate (i.e., the insulating layer) on one side of the flat circuit is removed to expose the embedded conductors. In some instances, one of the insulating layers on one side of the circuit is left shorter than the insulating layer on the opposite side of the circuit to expose distal ends of the conductors for connection to whatever connecting device(s) the circuit is to be electrically coupled.

Problems have been encountered in coupling such conductors as the flexible conductors of a flat circuit, particularly when the conductors are soldered and which requires the application of heat. In essence, the solder must be melted without melting the thin insulating films. Additionally, the parallel flexible conductors often are of varying widths in the same flat circuit and the resulting varying densities cause heat distribution problems. For instance, the heat required for soldering may be so intense in one area as to melt the insulating substrate or film and yet be insufficient in another area that a conductor or conductors are not adequately electrically coupled.

Various prior art methods have been used to electrically bond the conductors of flat circuits by soldering techniques. Such methods have included diode laser soldering and pulsed hot bar soldering. Laser soldering requires that several spot solder joints be made and scanned across the joint and this is a relatively time consuming process. Laser soldering requires expensive automation to focus the energy. Laser soldering also requires that the insulating substrate or film of the flat circuit to be transparent, and this is a problem with flame retardant material films that have opaque fillers as well as with opaque adhesives used in fabricating flat flexible circuits. Finally, laser soldering may require expensive stencils for soldering flat circuits.

Pulsed hot bar soldering processes also have had limited success in bonding the conductors of flat circuits. This process is not capable of heating relatively large conductors without melting the insulating substrates or films. Like laser soldering, the hot bar makes it difficult to focus energy to selective areas. The hot bar method relies on conduction and convection rather than a more desirable induction technique. Finally, heating heads for hot bar soldering apparatus are quite expensive.

The invention is directed to solving the above myriad of problems in an induction soldering process which uses unique magnetic concentrators. As is known, inductive coils create magnetic lines which pass through metal and cause eddy currents which, in turn, create friction and heat. The invention utilizes very simple and inexpensive magnetic concentrator blocks to selectively concentrate this heat wherever desired to melt the solder very quickly and evenly and bond the conductors without melting or damaging the insulating substrates or films.

SUMMARY OF THE INVENTION

An object, therefore, of the invention is to provide a new and improved apparatus and method for conductively bonding at least two conductors together. Although the invention is disclosed herein for soldering the conductors of flat circuits together, the invention should not be limited to such applications.

In the exemplary embodiment of the invention, the apparatus includes an inductive coil for generating a magnetic field when electrical current is run therethrough. A magnetic concentrator is disposed near the inductive coil and adjacent which a pair of conductors can be positioned for concentrating the magnetic field on the conductors. The magnetic concentrator is independent of the conductors. An applicator applies pressure to the two conductors. Therefore, the concentrator concentrates the magnetic field generated by the inductive coil on the conductors and thereby heats the conductors under pressure to electrically bond the conductors together.

As disclosed herein, the pressure applicator includes a movable ram having the inductive coil thereon. The ram moves toward and away from an anvil which includes the magnetic concentrator, preferably in the form of a ferrite block.

The invention is exemplified by using a plurality of the magnetic concentrators arranged in a row and adjacent which a planar array of conductors can be positioned, such as the conductors of a flat circuit. The concentrators are of varying masses or sizes for accommodating various sizes of conductors.

The invention also contemplates a method of conductively bonding the conductors and includes the steps of juxtaposing the conductors near the inductive coil and generating a magnetic field about the conductors in response to current run through the coil. A magnetic concentrator is located adjacent the conductors to concentrate the magnetic field on the conductors to heat the conductors. Pressure is applied to the conductors to facilitate electrically bonding the conductors together. Solder is applied to at least one of the conductors which, when heated, liquifies to facilitate the electrical bond between the conductors.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims.

The invention, together with its objects and the advantages thereof, may be best understood by reference to the following description taken in conjunction with the accompanying drawings, in which like reference numerals identify like elements in the figures and in which.

DETAILED DESCRIPTION OF THE PREFERRED EMBODIMENT

Figure 1:
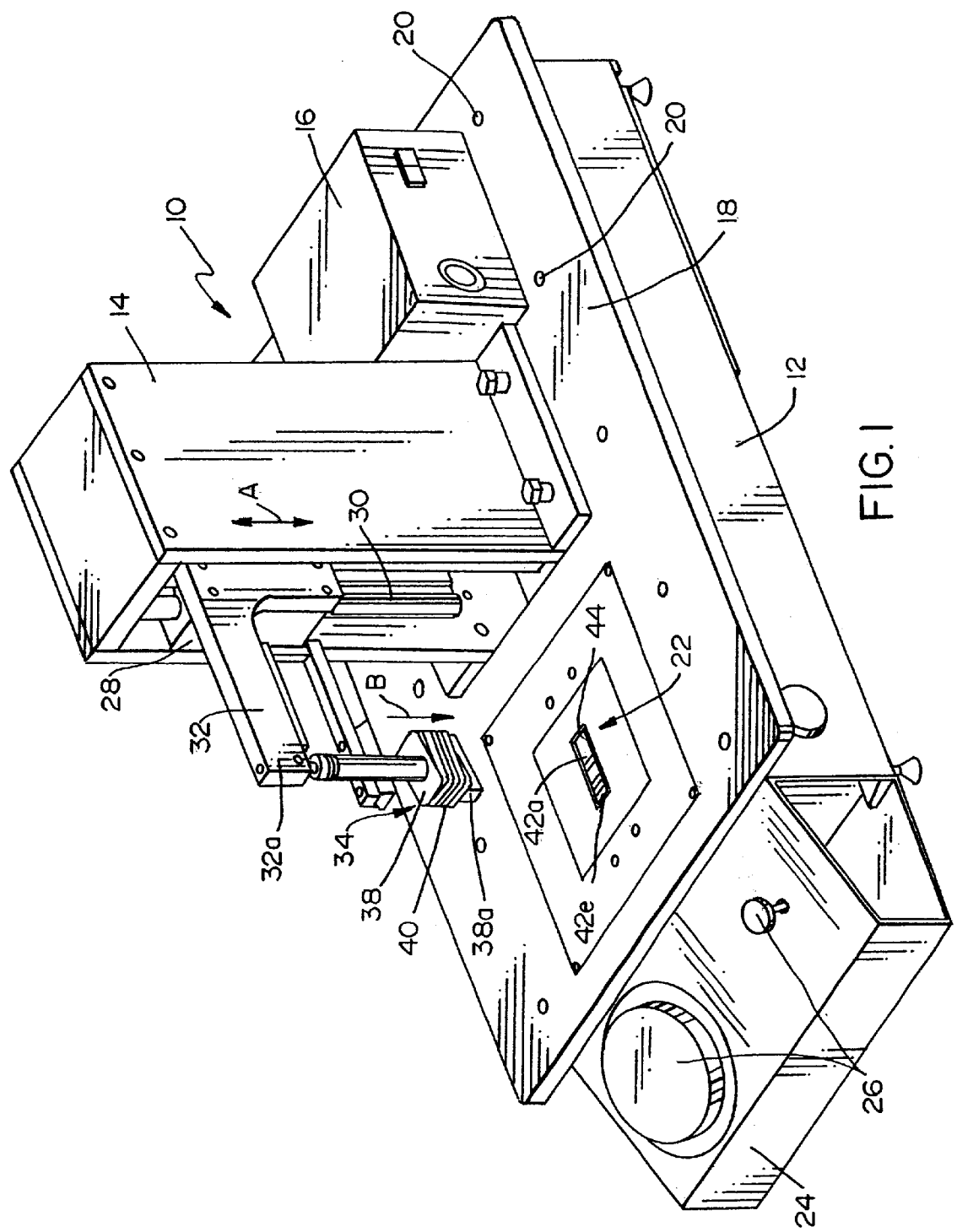
FIG. 1 is a perspective view of one type of apparatus for carrying out the invention.

Referring to the drawings in greater detail, and first to FIG. 1, an apparatus, generally designated 10, is illustrated for carrying out the invention. Although the apparatus in FIG. 1 for carrying out the invention appears to be fairly large, it is contemplated that the apparatus can be sized down to comprise a hand tool or a portable apparatus. The apparatus includes a base 12 mounting an upright support 14. An electrical control box 16 is located behind the upright support. A platen 18 is mounted by appropriate fasteners 20 on top of base 18 and defines a work station, generally designated 22. A console 24 projects forwardly of base 12 in front of work station 22 and includes various controls 26 for an operator.

Still referring to FIG. 1, a ram 28 is mounted for vertical reciprocating movement in the direction of double-headed arrow "A" on a vertical shaft 30. The ram may be movable hydraulically, pneumatically or mechanically such as with a spring. Moreover, the shaft 30 may comprise an externally threaded screw shaft for vertically moving ram 28 in response to rotation of the shaft. A ram arm 32 projects outwardly from upright support 14 and has a distal end 32a generally above work station 22.

Figure 2:
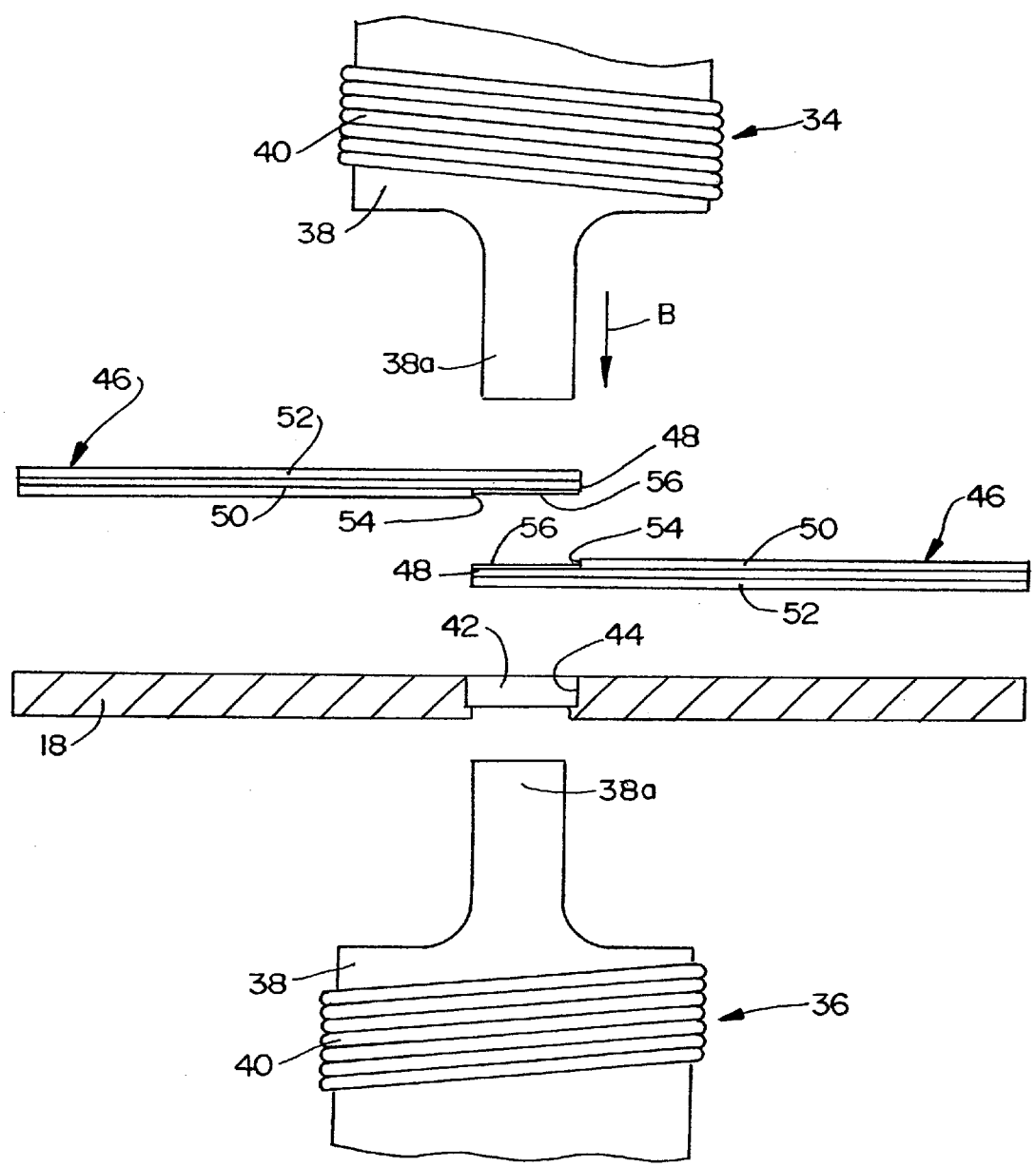
FIG. 2 shows a pair of opposing inductive coils with a magnetic concentrator and a pair of flat circuits disposed between the coils.

Referring to FIG. 2 in conjunction with FIG. 1, an inductive coil, generally designated 34, is mounted on the bottom of ram arm 32 beneath distal end 32a thereof. A second inductive coil, generally designated 36, is mounted below platen 18 within base 12. Each coil includes an armature 38 having a narrow distal end 38a. Windings 40 of the inductive coils are wrapped around armatures 38 and have leads (not shown) leading to a source of electrical current. The windings of inductive coil 34 are opposite the windings of inductive coil 36 whereby the coils are disposed such that they are mirror images of each other. In other words, one inductive coil is a right-hand coil and the other inductive coil is a left-hand coil. As is known, when current is applied through windings 40, the coils induce magnetic lines of flux about armatures 38 and particular distal ends 38a thereof.

Figure 3:
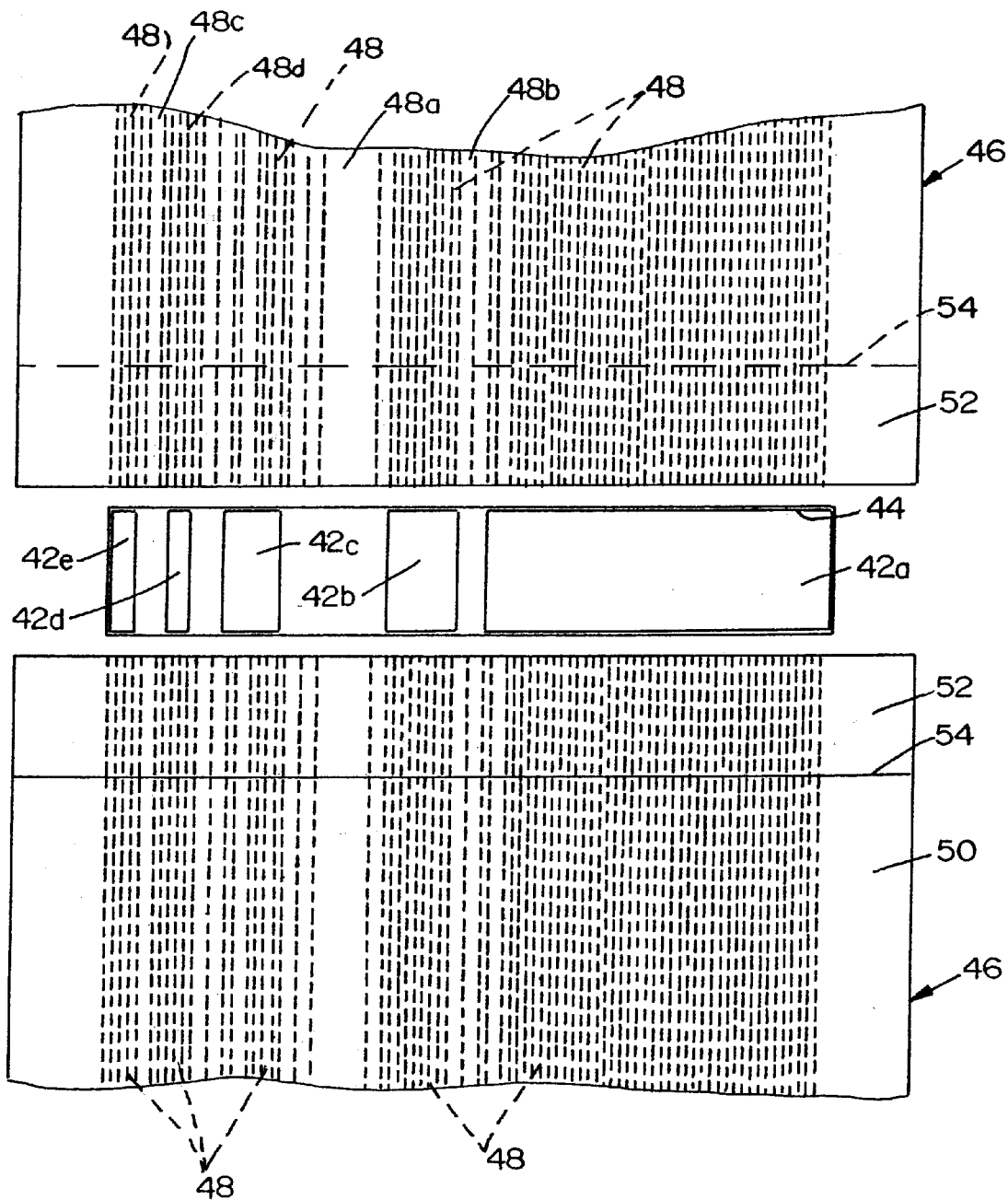
FIG. 3 shows a plan view of a pair of flat circuits adjacent a plurality of different sized magnetic concentrators.
Figure 4:
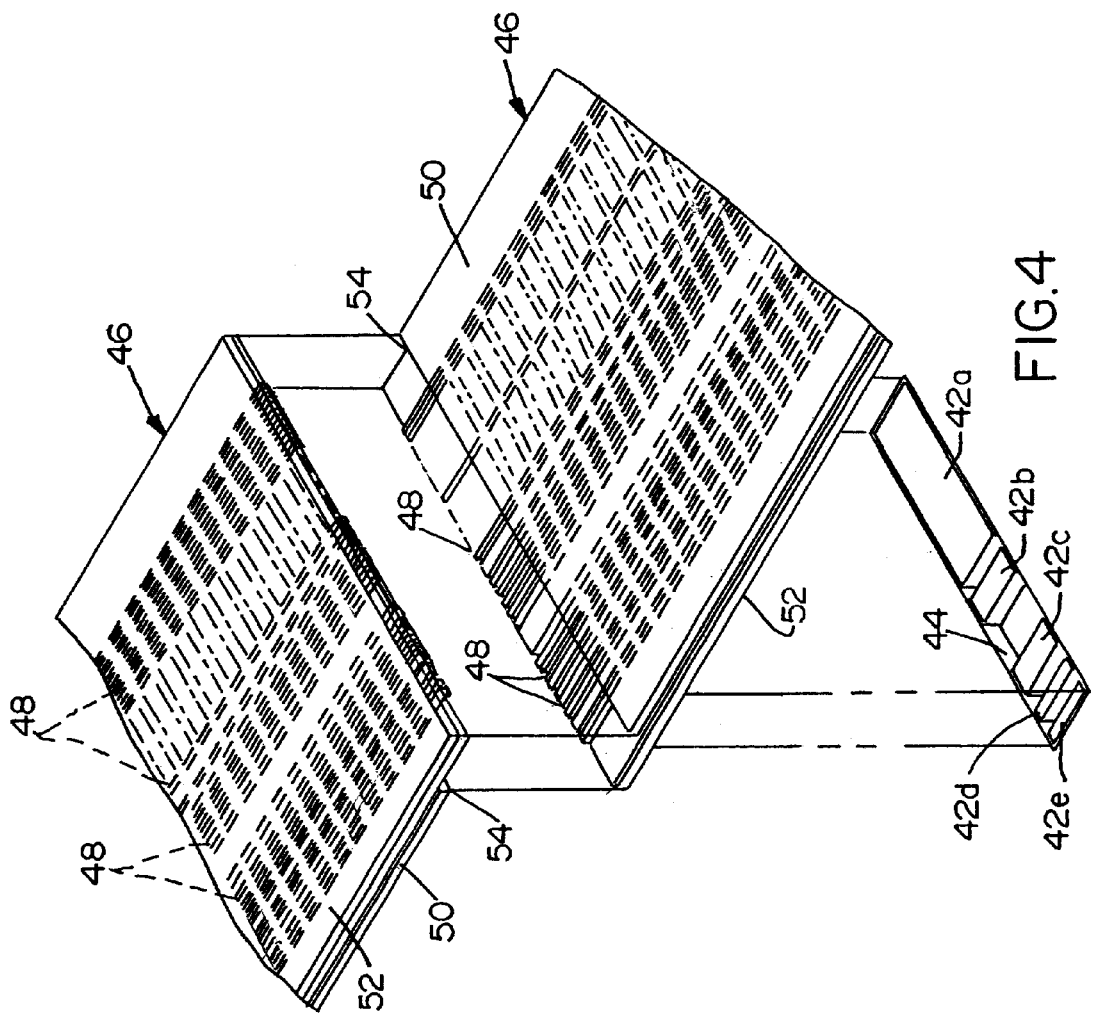
FIG. 4 is a fragmented perspective view showing the two flat circuits, with portions of the insulating films removed and in alignment with the magnetic concentrators.

Referring to FIGS. 3 and 4 in conjunction with FIGS. 1 and 2, at least one magnetic concentrator 42 (FIG. 2) is disposed between inductive coils 34 and 36. In the preferred embodiment and referring to FIGS. 3 and 4, a plurality of magnetic concentrators 42a–42e are located in a row within a trough 44 in the top of platen 18 (FIG. 1) at work station 22. The magnetic concentrators may be separated by dielectric blocks (not shown). These concentrators can suitably be made of ferrites of magneto dielectric material.

Referring to FIGS. 2–4, a pair of flat circuits, generally designated 46, are provided for conductively bonding by apparatus 10. The circuits may be flat flexible circuits, for instance. Each circuit includes a plurality of flexible conductors 48 which are parallel to each other and are embedded within or sandwiched between a pair of flat flexible substrates in the form of layers or films 50 and 52. The films may be of polyester material, for instance. Insulating film 50 is left shorter than insulating film 52, as at 54, to expose distal ends of conductors 48 for connection together, as described below. The exposed distal ends of the conductors may be covered or plated with a reflowable material 56 such as tin or solder as shown in FIG. 2.

Figure 5:
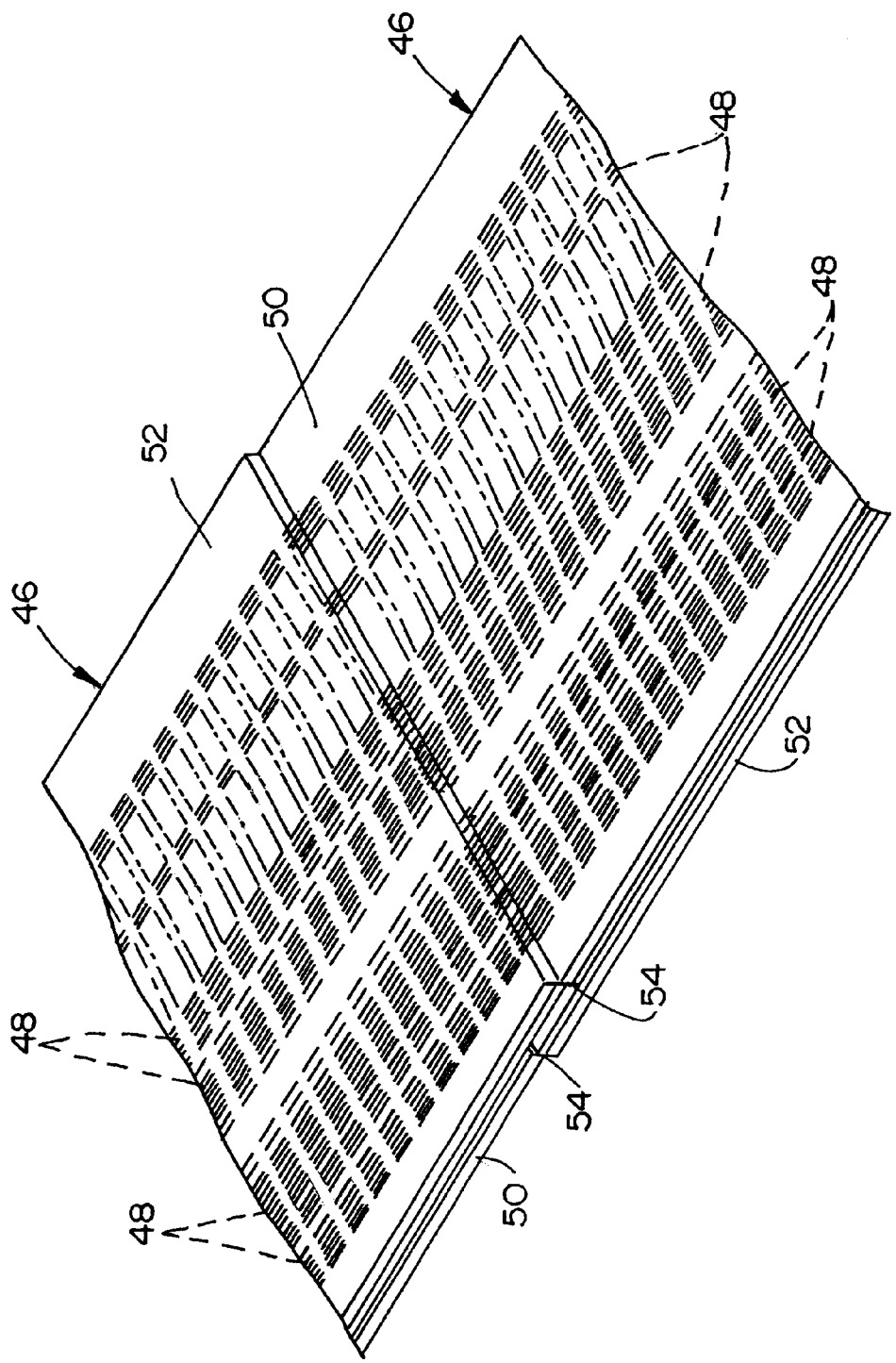
FIG. 5 is a fragmented perspective view of the flat circuits bonded together.

The conductive bonding of conductors 48 of circuits 46 will now be described according to the method of the invention. Specifically, two of the flat circuits prepared as described above are juxtaposed relative to each other as seen in FIGS. 2 and 4 so that the exposed distal ends of the conductors, and including solder material 56, face each other. The juxtaposed conductors then are lowered onto platen 18 so that the exposed conductors and solder material 56 are directly above magnetic concentrators 42a–42e. The magnetic block concentrators are firmly mounted within trough 44 in platen 18 as seen in FIG. 2 and, therefore, the concentrators act as an anvil. It is contemplated that concentrators 42a–42e may be embedded in a binder material or covered with a resilient material such as silicone, rubber or plastic to protect the concentrators from damage. Ram 28 (FIG. 1) and ram arm 32 are moved downwardly to move inductive coil 34 therewith in the direction of arrow "B" (FIG. 2). Distal end 38a of armature 38 of inductive coil 34 engages the top flat circuit 46 and applies pressure to the overlapped areas of the circuits which are sandwiched between distal end 38a of the armature and magnetic concentrators 42 which act as an anvil opposing the pressure. The distal end 38a of the lower armature 38 may also be elevated to a position sufficiently close to the underside of the concentrators 42, but is preferably stationed at a permanent position sufficiently close to the concentrators. Current then is run through windings 40 of inductive coils 34 and 36 to create eddy currents which pass through solder material 56. In essence, the eddy currents create friction and, thereby, heat sufficient to melt the solder or reflowable plating material. However, this heat must not be so intense as to melt insulating films 52 or 50 of flat circuits 46. By appropriately sizing magnetic concentrators 42a–42e, these magnetic blocks control the heat, allowing the solder to melt without melting the polyester films of the circuits. In essence, the ferrite blocks concentrate the magnetic lines of flux toward the solder-coated conductors. Moreover, heating is performed for a very short duration; e.g., 0.1 to 2 seconds to avoid overheating the film. The resulting bonded circuit interface is shown in FIG. 5.

With the above understanding of the method of operation of the invention, reference is made to FIGS. 3 and 4 where it can be seen that the magnetic concentrators 42a–42e are of varying sizes, volumes or masses complementary to the varying sizes or widths of conductors 48 across the widths of flat circuits 46. For instance, as shown in FIG. 3, the right-hand side of the flat circuits in FIGS. 3 and 4 show an array of relatively narrow conductors. The narrow conductors do not generate as much heat as the wider conductors such as conductors 48a, 48b, 48c and 48d. Hence, concentrator 42a is used to focus a greater portion of the magnetic field on these narrow conductors, so they will generate sufficient heat to reflow the solder or tin 56 on the conductors. However, with respect to relatively wide conductors 48a, 48b, 48c and 48d, the mass of the conductor metal material is sufficient to generate enough heat to reflow the solder or tin 56 on the conductors. The use of a concentrator at the joinder of the wider conductors 48a, 48b, 48c and 48d could actually generate enough heat to cause the insulating films of the circuits to melt. Hence, no concentrator is disposed at the joinder of the wider conductors 48a, 48b, 48c and 48d. Of course, the size, configuration, spacing, number, etc. of magnetic concentrators 42a–42e will vary considerably depending upon the configuration of the conductors of flat circuits 46. The shape of the concentrators may also take a geometry other than that of the rectangular blocks illustrated to optimize the concentration of the magnetic field to the appropriate conductor. Other suitable geometries may include cylinders, cones, pyramids, etc.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An apparatus for conductively bonding the conductors of a pair of flat circuits in which the conductors are generally parallel and at different densities laterally of the circuits, comprising:

a platen defining a work station;

locating means on the platen at the work station and above which opposing ends of the pair of flat circuits can be overlapped with the conductors of the overlapped circuits juxtaposed, the locating means being elongated transversely of the parallel conductors;

an inductive coil above the locating means and including an armature and a winding for generating a magnetic field when electrical current is run therethrough;

a plurality of magnetic concentrators disposed in an elongated array on said locating means transversely of the parallel conductors for concentrating the magnetic field on the conductors, the concentrators being independent of the inductive coil and the conductors, and the plurality of concentrators having different masses corresponding to the different densities of the conductors laterally of the circuits; and an applicator for applying pressure to the juxtaposed conductors, whereby the concentrators concentrate the magnetic field generated by the inductive coil on the conductors at different concentrations laterally of the circuits corresponding to the different densities of the conductors thereby heating the conductors under pressure and electrically bonding the conductors together.

2. The apparatus of claim 1 wherein said locating means comprises a trough in the platen and in which the concentrators are located.

3. The apparatus of claim 1 wherein said applicator comprises a movable ram.

4. The apparatus of claim 3 wherein said ram comprises the armature of said inductive coil.

5. The apparatus of claim 3, including an anvil opposing said movable ram.

6. The apparatus of claim 5 wherein said anvil includes said magnetic concentrators.

7. The apparatus of claim 6 wherein said ram comprises the armature of said inductive coil.

8. The apparatus of claim 1 wherein said magnetic concentrators comprise ferrite blocks.

9. The apparatus of claim 1 wherein said magnetic concentrators comprise magnetic dielectric blocks.

10. An apparatus for conductively bonding the conductors of a pair of flat circuits in which the conductors are generally parallel and at different densities laterally of the circuits, comprising:

a platen defining a work station;

an inductive coil above the work station and beneath which opposing ends of the pair of flat circuits can be overlapped with the conductors of the overlapped circuits juxtaposed, the inductive coil including an armature and a winding for generating a magnetic field when electrical current is run therethrough;

a plurality of magnetic concentrators disposed in an elongated array at the work station transversely of the parallel conductors for concentrating the magnetic field on the conductors, the concentrators being independent of the inductive coil and the conductors, and the plurality of concentrators having different masses corresponding to the different densities of the conductors laterally of the circuits; and an applicator for applying pressure to the juxtaposed conductors, whereby the concentrators concentrate the magnetic field generated by the inductive coil on the conductors at different concentrations laterally of the circuits corresponding to the different densities of the conductors thereby heating the conductors under pressure and electrically bonding the conductors together.

11. The apparatus of claim 10 wherein said applicator comprises a movable ram.

12. The apparatus of claim 11 wherein said ram comprises the armature of said inductive coil.

13. The apparatus of claim 11, including an anvil opposing said movable ram.

14. The apparatus of claim 13 wherein said anvil includes said magnetic concentrators.

15. The apparatus of claim 14 wherein said ram comprises the armature of said inductive coil.

16. The apparatus of claim 10 wherein said magnetic concentrators comprise ferrite blocks.

17. The apparatus of claim 10 wherein said magnetic concentrators comprise magnetic dielectric blocks.

18. A method of conductively bonding the conductors of a pair of flat circuits in which the conductors are generally parallel and at different densities laterally of the circuits, comprising:

providing a platen defining a work station;

overlapping opposite ends of the pair of flat circuits at the work station with the conductors of the overlapped circuits juxtaposed;

locating an inductive coil at the work station and including an armature and a winding near the juxtaposed conductors and generating a magnetic field about the conductors in response to electrical current run through the coil;

locating a plurality of magnetic concentrators in an elongated array at the work station transversely of the parallel conductors for concentrating the magnetic field on the conductors, the concentrators being independent of the inductive coil and the conductors, and the plurality of concentrators being provided with different masses corresponding to the different densities of the conductors laterally of the circuits; and applying pressure to the juxtaposed conductors of the flat circuits to facilitate electrically bonding the conductors together.

19. The method of claim 18 wherein the winding of said inductive coil is wound about a ram to apply said pressure, the ram comprising the armature of the inductive coil.

20. The method of claim 19, including providing an anvil opposing said ram, the anvil including said plurality of magnetic concentrators.

21. The method of claim 18 wherein said magnetic concentrators are provided as ferrite blocks.

22. The method of claim 18, including applying solder to the conductors of at least one of the flat circuits, the solder liquefying when heated to facilitate the electrical bond between the conductors.

* * * * *